United States Patent
Hein et al.

(10) Patent No.: US 8,201,071 B2
(45) Date of Patent: Jun. 12, 2012

(54) INFORMATION TRANSMISSION AND RECEPTION

(75) Inventors: Thomas Hein, Munich (DE); Rex Kho, Holzkirchen (DE); Aaron John Nygren, Munich (DE)

(73) Assignee: Qimonda AG, Munich (DE)

( * ) Notice: Subject to any disclaimer, the term of this patent is extended or adjusted under 35 U.S.C. 154(b) by 1155 days.

(21) Appl. No.: 11/599,992

(22) Filed: Nov. 15, 2006

(65) Prior Publication Data

US 2008/0115030 A1 May 15, 2008

(51) Int. Cl.
*H03M 7/14* (2006.01)
(52) U.S. Cl. .................. 714/809; 341/58; 714/811
(58) Field of Classification Search .................. 714/809, 714/811; 341/58
See application file for complete search history.

(56) References Cited

U.S. PATENT DOCUMENTS

| | | | | |
|---|---|---|---|---|
| 3,851,106 A * | 11/1974 | Jacobaeus | ..................... | 370/477 |
| 4,223,326 A * | 9/1980 | D'Amato et al. | ............. | 714/800 |
| 4,284,843 A * | 8/1981 | White | ......................... | 178/69 G |
| 4,309,694 A * | 1/1982 | Henry | .............................. | 341/58 |
| 4,486,739 A * | 12/1984 | Franaszek et al. | .............. | 341/59 |
| 4,499,454 A * | 2/1985 | Shimada | .......................... | 341/58 |
| 4,736,464 A * | 4/1988 | Tanson | .......................... | 398/176 |
| 4,811,361 A * | 3/1989 | Bacou et al. | .................. | 375/242 |
| 4,876,695 A * | 10/1989 | Witters et al. | .................. | 375/211 |
| 4,975,916 A * | 12/1990 | Miracle et al. | ................ | 714/798 |
| 5,025,458 A * | 6/1991 | Casper et al. | ................. | 375/365 |
| 5,048,062 A * | 9/1991 | Gregg et al. | .................. | 375/365 |
| 5,144,305 A * | 9/1992 | Gotz et al. | ........................ | 341/73 |
| 5,177,482 A * | 1/1993 | Cideciyan et al. | .............. | 341/59 |
| 5,434,872 A * | 7/1995 | Petersen et al. | ................ | 714/811 |
| 5,546,425 A * | 8/1996 | Auclair et al. | ................. | 375/220 |
| 5,692,021 A * | 11/1997 | Walker | .......................... | 375/354 |
| 5,825,824 A * | 10/1998 | Lee et al. | ....................... | 375/292 |
| 5,862,160 A * | 1/1999 | Irvin et al. | ...................... | 714/807 |
| 5,907,566 A * | 5/1999 | Benson et al. | ................ | 714/798 |
| 5,944,843 A * | 8/1999 | Sharma et al. | ................ | 714/701 |
| 6,243,768 B1 | 6/2001 | Khandekar | | |
| 6,346,895 B1 * | 2/2002 | Lee et al. | .......................... | 341/58 |
| 6,351,501 B1 * | 2/2002 | Murdock | ........................ | 375/292 |
| 6,405,340 B1 * | 6/2002 | Irvin et al. | ...................... | 714/774 |
| 6,414,956 B1 * | 7/2002 | Szczepanek | ................... | 370/392 |
| 6,535,858 B1 * | 3/2003 | Blaukovitsch et al. | ......... | 705/57 |
| 6,768,429 B2 * | 7/2004 | Kuo et al. | ......................... | 341/58 |
| 6,910,167 B2 * | 6/2005 | Barton et al. | .................. | 714/746 |
| 6,950,448 B2 * | 9/2005 | Tornetta et al. | ............... | 370/537 |
| 7,016,430 B1 * | 3/2006 | Grivna et al. | .................. | 375/285 |
| 7,024,518 B2 | 4/2006 | Halbert et al. | | |
| 7,038,599 B2 * | 5/2006 | Kahlman | ......................... | 341/58 |
| 7,158,575 B2 * | 1/2007 | Gorecki et al. | ............... | 375/259 |

(Continued)

FOREIGN PATENT DOCUMENTS

DE 10 2005 011 386 A1 9/2006

*Primary Examiner* — Stephen Baker
(74) *Attorney, Agent, or Firm* — John S. Economou

(57) ABSTRACT

An information transmitting apparatus is described. An interface includes a first input for a valid data word, a second input for an information to be transmitted, and an output, wherein the interface provides the data word or a data word recognizable as an invalid data word at the output, depending on the information. Accordingly, an information receiving apparatus comprises an interface comprising an input for a data word and an output for an information, wherein the interface derives the information depending on whether the data word is a valid data word or an invalid data word.

9 Claims, 5 Drawing Sheets

U.S. PATENT DOCUMENTS

| | | | |
|---|---|---|---|
| 7,187,307 B1 * | 3/2007 | Schmidt et al. | 341/50 |
| 7,222,270 B2 * | 5/2007 | Meaney et al. | 714/48 |
| 7,236,686 B2 * | 6/2007 | Ezaki | 386/240 |
| 7,249,305 B2 * | 7/2007 | Kojima et al. | 714/755 |
| 7,280,053 B2 * | 10/2007 | Hori | 341/51 |
| 7,298,294 B1 * | 11/2007 | Oberg et al. | 341/58 |
| 7,535,836 B2 * | 5/2009 | Lund | 370/230 |
| 2002/0156953 A1 | 10/2002 | Beiley et al. | |
| 2003/0202610 A1 * | 10/2003 | Terada et al. | 375/259 |
| 2003/0227947 A1 * | 12/2003 | Shin et al. | 370/522 |
| 2003/0237041 A1 * | 12/2003 | Cole et al. | 714/776 |
| 2004/0153613 A1 | 8/2004 | Roohparvar | |
| 2004/0153952 A1 * | 8/2004 | Sharma et al. | 714/781 |
| 2004/0257248 A1 * | 12/2004 | Lund et al. | 341/58 |
| 2006/0153116 A1 * | 7/2006 | Lida et al. | 370/315 |
| 2006/0215473 A1 | 9/2006 | Dietrich | |
| 2006/0267810 A1 * | 11/2006 | Widmer | 341/51 |
| 2007/0204204 A1 * | 8/2007 | Sul et al. | 714/776 |

* cited by examiner

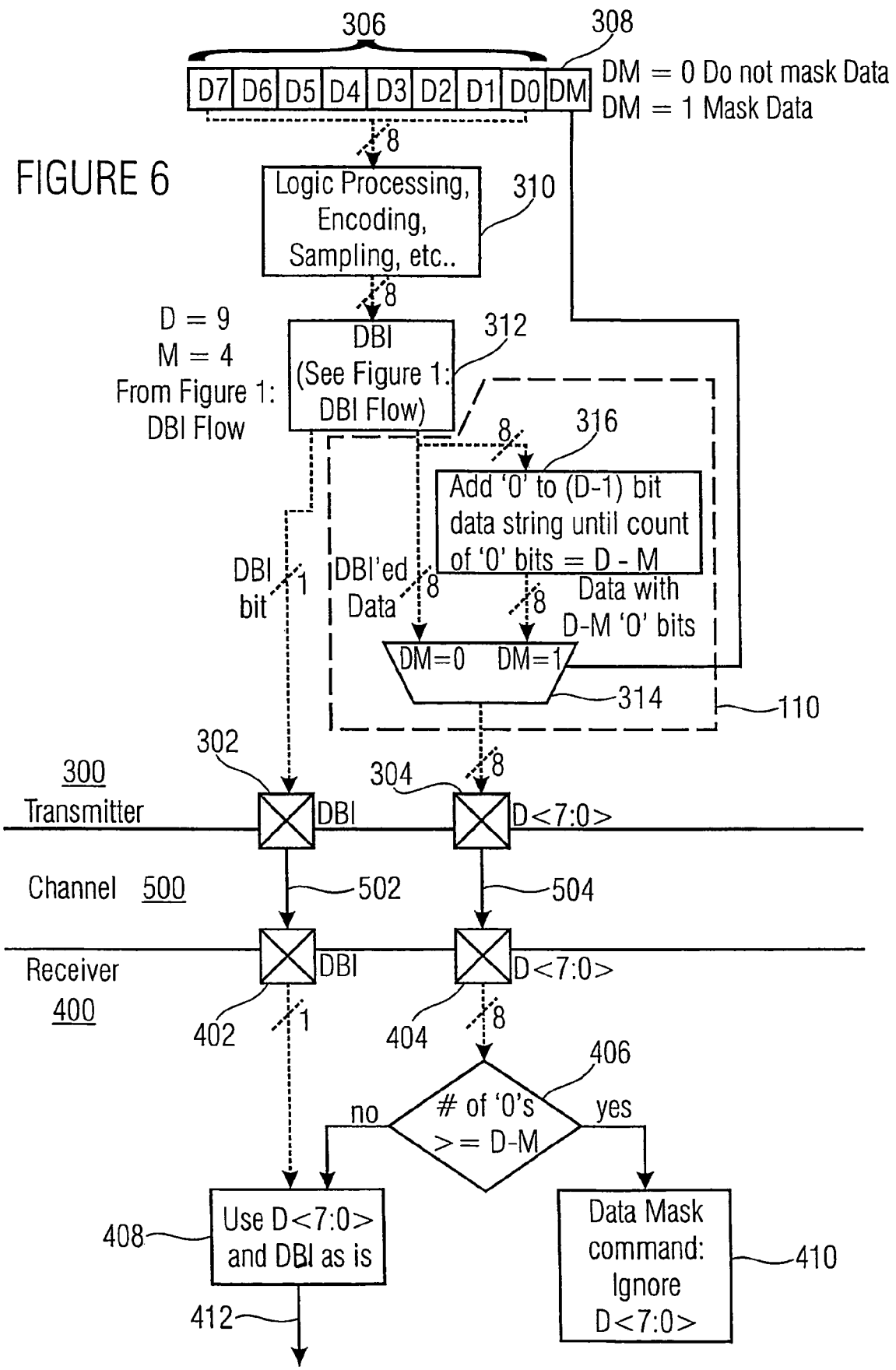

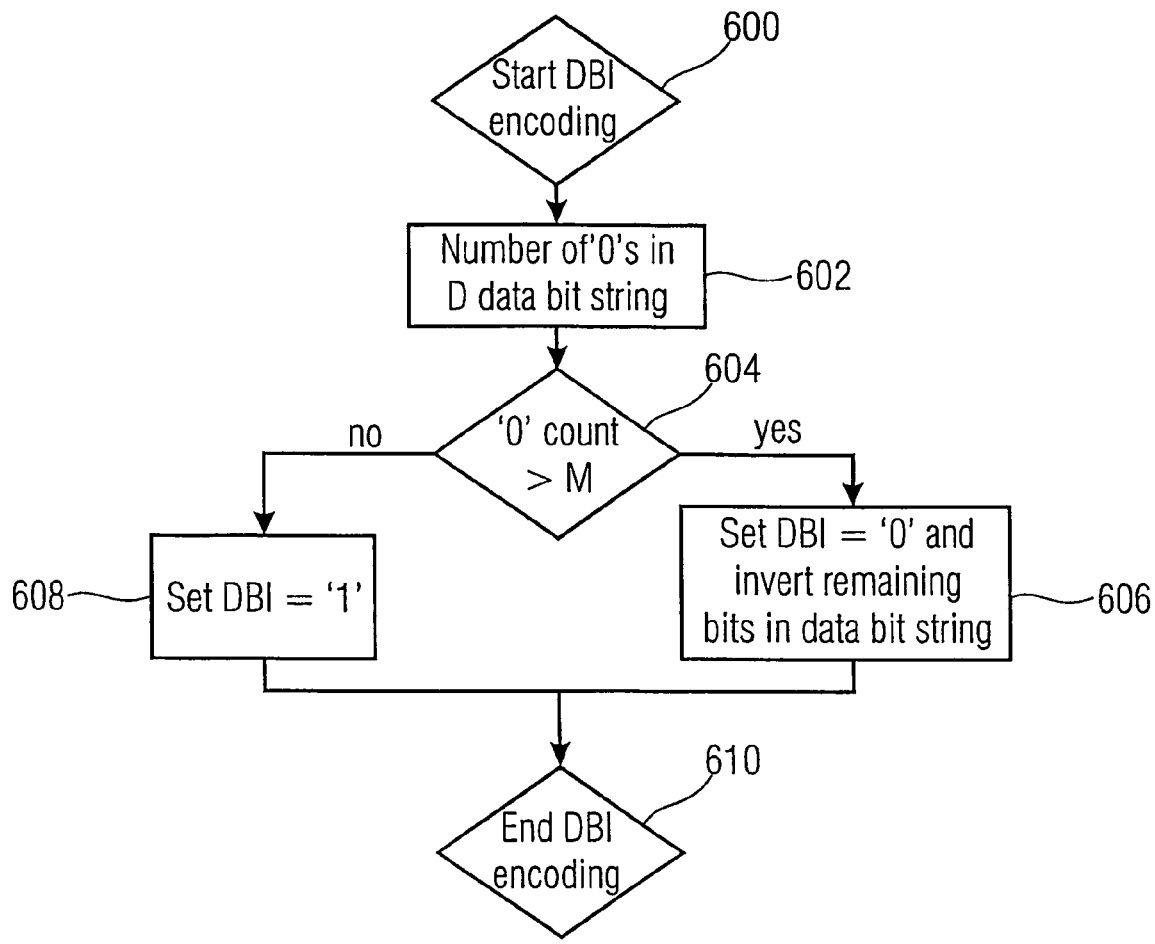
FIGURE 7
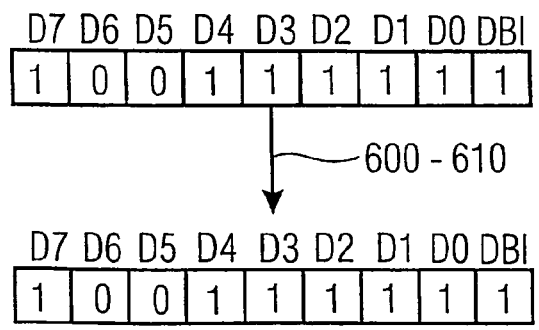
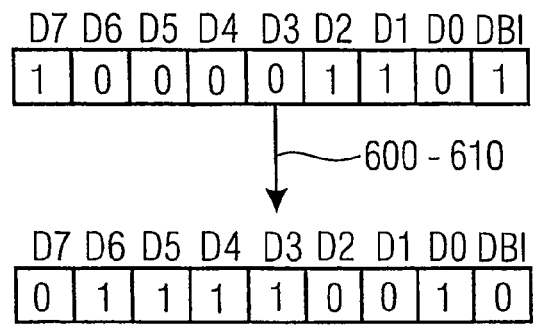
FIGURE 8A                FIGURE 8B

INFORMATION TRANSMISSION AND RECEPTION

TECHNICAL FIELD

The present invention relates to information transmission and reception, such as the transmission and reception of a data-masking signal.

BACKGROUND

In modern high-speed electronic systems, pin counts are of high importance. This is the same for memory and CPU/GPU systems. Current DRAM systems offer features such as DBI (DBI=Data Bit Inversion), DM (DM=Data Masking), EDC (EDC=Error Detecting Code); training algorithms, etc. All these features require additional commands and frequently additional pins. Tradeoffs are normally made between performance, additional command complexity, pin count, and implementation complexity. For example, it is possible to provide dedicated DM pins. This enables maximum DM bandwidth, but at the cost of additional pins. Another possibility would be to transmit DM over the normal data pins. This saves pins, but at the cost of data bandwidth, since the data and the DM signal cannot be transmitted in parallel. Moreover, the common complexity is also increased. A further possibility would be to transmit the DM signal over address pins. This allows the DRAM signal to be transmitted parallel to the data, but also introduces new commands, and limits the bandwidth for transmission of the DM signal. In addition, there are normally fewer address pins in comparison to data pins.

SUMMARY OF THE INVENTION

According to an embodiment of the present invention, an information transmitting apparatus comprising an interface comprising a first input for a valid data word, a second input for an information to be transmitted, and an output, wherein the interface provides the data word or a data word recognizable as an invalid data word at the output, depending on the information.

Accordingly, to an embodiment of the present invention, an information receiving apparatus comprising an interface comprising an input for a data word and an output for an information, wherein the interface derives the information depending on whether the data word is a valid data word or an invalid data word.

According to another embodiment of the present invention, an information transmitting apparatus, comprising an n-bit data input for an actual n-bit data word to be transmitted; a data bit inversion module coupled to the n-bit data input, and comprising an m-bit data output for an m-bit data word, the m-bit data word comprising an n-bit output data word and an inversion signal, the n-bit output data word being either inverted or non-inverted relative to the actual n-bit data word to be transmitted with the inversion signal indicating the inversion or non-inversion such that a number of 0s or 1s within bits of the m-bit data word is within a predetermined range; an m-bit data word output connectable to a receiver; an information input for an information to be transmitted; and a modifier coupled between the m-bit data output and the m-bit data word output, and being coupled to the information input, so as to provide at the m-bit data word output, the m-bit data word from the data bit inversion module or, instead of the m-bit data word from the data bit inversion module, an invalid m-bit data word in which the number of 0s or 1s within the bits of the invalid m-bit data word is not within the predetermined range.

Accordingly, to an embodiment of the present invention, an information receiving apparatus, comprising an m-bit data word input for an m-bit data word including an inversion signal and an n-bit data word; and a determiner coupled to the m-bit data word input and comprising an information output for an information signal representing an information, the information signal depending on whether the number of 0s or 1s within bits of the m-bit data word is within a predetermined range.

BRIEF DESCRIPTION OF THE DRAWINGS

In the following, further embodiments of the present invention are described with respect to the drawings in more detail. There it is shown in FIG. 1 is a block diagram of an information transmitting apparatus according to an embodiment of the present invention;

FIG. 6 is a schematic block diagram of an arrangement of a transmitter and a receiver with data masking transmission via a data channel according to an embodiment of the present invention;

FIG. 7 is a flow diagram illustrating the mode of operation of the data bit inversion module in FIG. 6; and FIGS. 8a and 8b are the different examples for inbound and outbound data bit strings for illustrating the effect of the data bit inversion of the data bit inversion module of FIG. 6.

Figure 1:
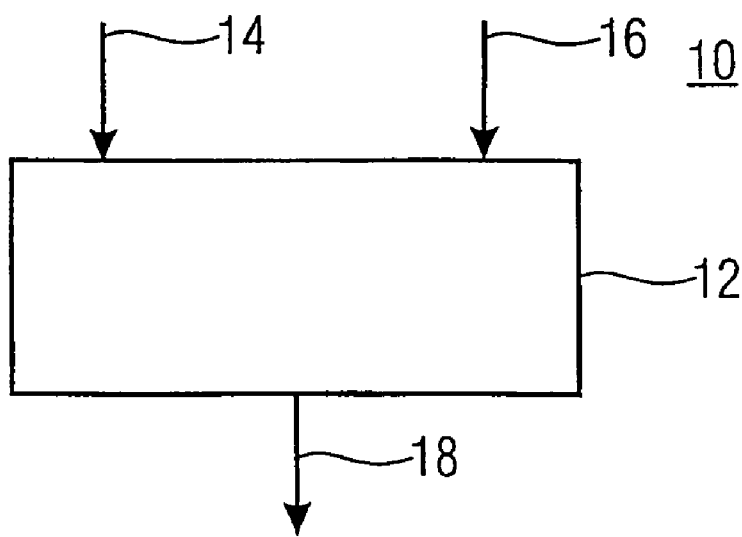

The following list of reference symbols can be used in conjunction with the figures:
10 information transmitting apparatus
12 interface
14 first input
16 second input
18 output
20 information receiving apparatus
22 interface
24 input
26 output
100 information transmitting apparatus
102 interface
104 data input
106 data output
108 indication output
110 modifier
112 information input
114 information transmitting apparatus output
200 information receiving apparatus
200' information receiving apparatus
200" information receiving apparatus
202 data input
204 indication input
206 determiner 208 information receiving apparatus output
210 reconstruction module
212 data word output
214 discarder
300 transmitter
302 DBI pin
304 data pins
306 input data register
308 DDDM signal register
310 processor
312 DBI module
314 multiplexer
316 invalidator
400 receiver
402 DBI pin
404 data pins
406 determining/discarding module
408 reconstruction module
410 data mask command signaling output
412 data word output
500 channel
502 sub-channel
504 sub-channel

DETAILED DESCRIPTION OF ILLUSTRATIVE EMBODIMENTS

FIG. 1 shows an information transmitting apparatus 10 comprising an interface 12, the interface comprising a first input 14, and a second input 16 and an output 18.

The interface 12 receives valid data words at the first input 14. At the second input 16, the interface 12 receives the information to be transmitted. The information to be transmitted may be of a binary type. However, the information to be transmitted may also assume more than two different states. In case of more than two states the information at the second input 16 may assume, one state of the information to be transmitted is distinguishable from the others as a state where, in fact, no information is currently to be transmitted. For example, the information to be transmitted may be used to switch a receiver to which the output 18 is coupled, into a certain operational mode, such as a power saving mode, and back. In such a case, the information to be transmitted may assume three states: no command, command to switch to this operational mode, and command to switch back from this operational mode, such as into normal mode. According to the following more detailed embodiments, the information to be transmitted is exemplarily a data masking signal, signaling as to whether a masking of the data word at the first input is to be performed or not.

Interface 12 is designed to, depending on the information to be transmitted at the second input 16, provide the data words from the first input 14 at the output 18, or a data word recognizable as an invalid data word at the output 18. To be more precise, in the absence of information to be transmitted at the second input 16, i.e., no information to be transmitted has to be signaled to the receiver, the interface 12 passes the valid data words from the first input 14 to the output 18. However, in case information to be transmitted at the second input 16 has to be signaled to the receiver, the interface 12 replaces a data word at the first input 14 by another data word recognizable as an invalid data word and outputs the latter at output 18 instead. For example, the output 18 is an n-bit output so that $2^n$ possible bit combinations are representable at output 18. However, the valid data word at the first input 14 merely assumes bit combinations of these $2^n$ possible bit combinations, within a subset of these $2^n$ possible bit combinations, so that at least one of the $2^n$ possible bit combinations lies outside this subset and may serve as the above-mentioned invalid data word. Hence, at the receiver, the signaling of the information to be transmitted is recognizable, depending on whether the data word at the output 18 is valid or invalid, i.e., falls within the subset or not.

Figure 2:
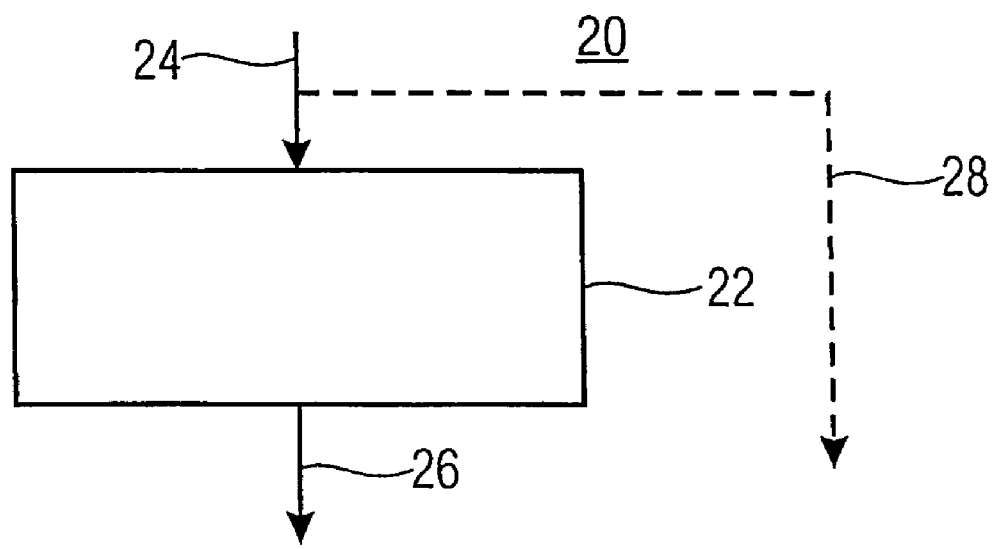
FIG. 2 is a block diagram of an information receiving apparatus according to an embodiment of the present invention.

FIG. 2 shows an information receiving apparatus 20, suitable for receiving the information to be transmitted from the information transmitting apparatus 10 of FIG. 1. The information receiving apparatus 20 comprises an interface 22, which in turn, comprises an input 24, connectable to the output 18 of the information transmitting apparatus 10 of FIG. 1, and an output 26 for the information to be received. As already mentioned above, the data words incoming at input 24 are either valid or invalid, depending on the information to be transmitted, i.e., depending on whether the information to be transmitted signalizes something, or not. In the absence of signaling information to be transmitted, the data word at the input 24 is valid, and therefore, readily available for the receiver as it is illustrated by means of the dashed line 28 in FIG. 2. However, in order to make available the signaling information transmitted along with the data words at the input 24 at the receiver side, the interface 22 determines whether the current data word at the input 24 is a valid data word or an invalid data word. As already mentioned above, this determination may comprise the determination as to whether the data word falls within a predetermined subset of possible n-bit combinations. If the result of the determination is negative, i.e. if the data word is valid, the interface 22 concludes therefrom that, at the moment, no signaling is hidden in the data at the input 24, and outputs the result of this derivation at the output 26.

However, in case of an invalid data word at the input 24, the interface 22 interprets this as a signalization of information to be transmitted from the transmitter side. The meaning of the signalization depends on the application. For example, in the case of binary information to be transmitted, the interface 22 merely has to indicate the detected signalization at the output 26. In case of a three-state or more-state information to be transmitted, interface 22 may distinguish between different kinds of signalizations by means of an evaluation of a part of or the whole invalid data word. For example, there may exist two or more invalid data words besides the subset of valid data words. In this case, one or more of the invalid data words may signalize a first command, whereas another invalid data word or other invalid data words may signalize another command, with the interface 22 outputting these commands at output 26. With regard to the above-mentioned example, one command could be to enter a power saving mode whereas the other command could be to close the power saving mode. In the meantime, in case of valid data words entered at input 24, no command would be signalized at output 26.

In the following embodiments, the information to be transmitted is a signalization, whether the data words to be transmitted or the data words received, respectively, are to be masked or not. That is, the information to be transmitted signalizes or is active, when the data word to be transmitted is not to be used or discarded by the receiver.

Figure 3:
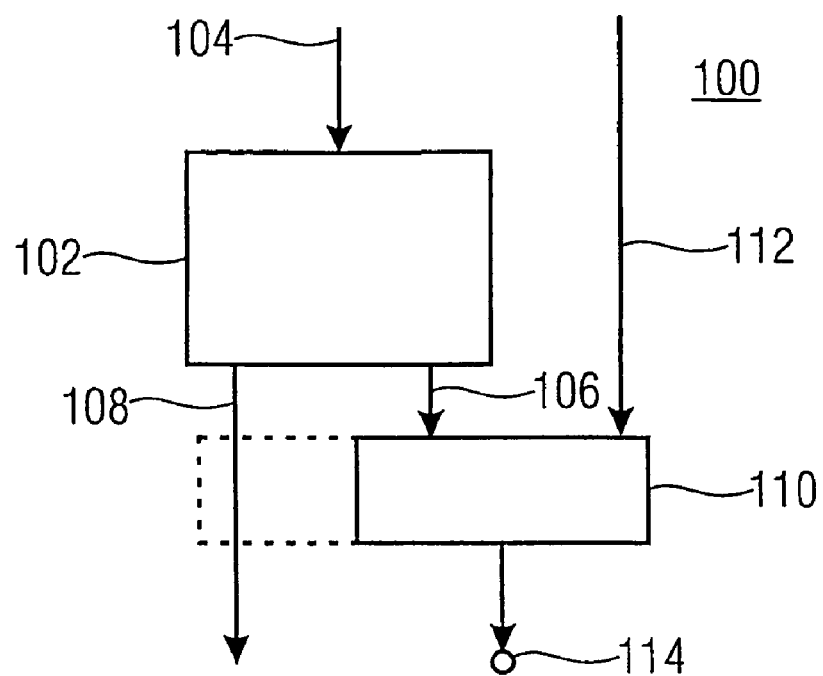
FIG. 3 is a block diagram of an information transmitting apparatus according to a further embodiment of the present invention.

FIG. 3 shows an information transmitting apparatus 100. It comprises an interface 102 having a data input 104, a data output 106 and an indication output 108, and a modifier 110 having an information input 112 and being coupled between the data output 106 of the interface 102 and an information transmitting apparatus output 114 of the information transmission apparatus 100. The output 114, as well as the indication output 108, are dedicated for being connected to a receiver.

The mode of operation of the modifier 110 is substantially the same as that described above with respect to the interface 12 in FIG. 1. That is, the modifier 110 receives the information to be transmitted, i.e., the data mask signal, at information input 112, and receives valid data words from the data output 106 of the interface 102, the validity of the data words being ensured by the interface 102 in a way described in the following. Further, the modifier 110 allows the data word to pass from the data output 106 to output 114 in case the data mask signal is disabled, i.e., does not signalize data masking, and outputs an invalid data word at output 114 instead of the valid data word received from data output 106, in case of an enabled data mask signal at information input 112, i.e., in case of the data mask signal signalizing data masking.

The interface 102 receives an n-bit data word at data input 104 and outputs the n-bit data word at the data output 106, which is modified or non-modified relative to the n-bit data word received from data input 104, in particular, such that the number of 0s in the n-bit data word output at the data output 106, is always within a predetermined range defined by, for example, a lower and an upper limit, or such that the number of 1s in the n-bit data word at the data output 106 is always within this predetermined range. In the following examples described in FIGS. 6 to 8b, the modification exemplarily is an inversion and the predetermined range extends from 0 to a predetermined limit or a predetermined limit to n, respectively.

In order to enable the reconstruction of the intended data word to be transmitted at data input 104 at the receiver side, interface 102 signalizes the modification or non-modification of the data word at the data output 106 relative to the data word at the data input 104, by means of a modification signal at the indication output 108.

Figure 4:
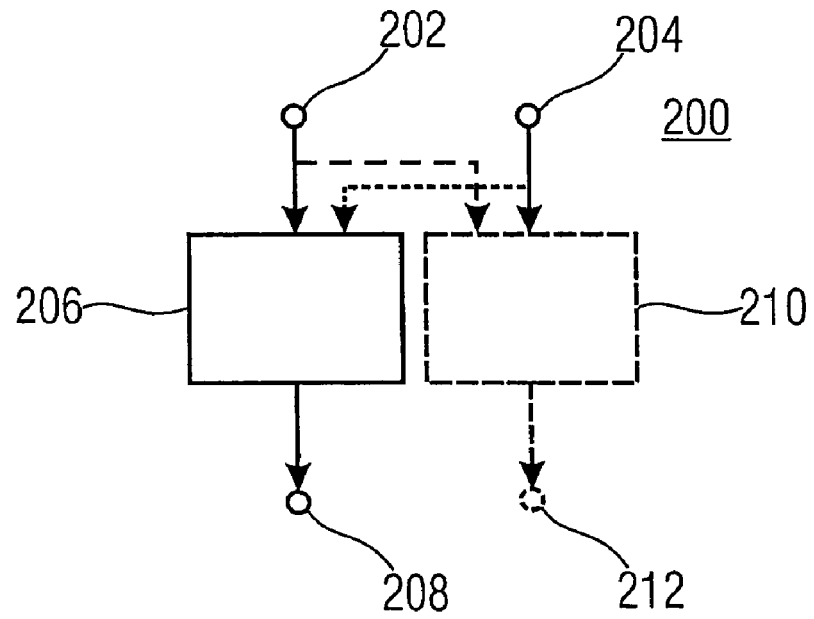
FIG. 4 is a block diagram of an information receiving apparatus according to a further embodiment of the present invention.

FIG. 4 shows an information receiving apparatus 200 suitable for receiving and detecting the data masking signal from the information transmitting apparatus 100 of FIG. 3. The information receiving apparatus 200 comprises a data input 202, being connectable to the information transmitting apparatus output 114 of the data transmission apparatus 100 of FIG. 3, an indication input 204 being connectable to the indication output 108 of FIG. 3, a determiner 206 and an information receiving apparatus information receiving apparatus output 208, the determiner 206 being coupled between the data input 202 and an information receiving apparatus output 208. As has becomes clear from the above description of FIG. 3, the n-bit data words incoming at data input 202 are valid, in case of the data masking signal being disabled, so that a reconstruction interface (module) 210 could easily reconstruct the actual data words to be transmitted from the data word received at data input 202 and the modification signal received at indication input 204 and output these actual data words at a data word output 212, as is illustrated by means of the dashed lines in FIG. 4.

The determiner 206 checks as to whether the number of 0s or 1s in the n-bit data word received from the data input 202 lies within the predetermined range or not. If not, the determiner 206 concludes that a data masking has been instructed and signals this data masking command at information receiving apparatus output 208. Otherwise, the determiner signalizes the absence of a data-masking signal.

As has been described with respect to FIG. 4, it is possible to reconstruct the actual data word from the data word at data input 202 and the modification signal at indication input 204. However, in case of an enabled data-masking signal, such a reconstructed data word is not to be used or is to be discarded. For example, the information receiving apparatus is part of a memory unit, and in case of an enabled data-masking signal, the reconstructed data word is not to be stored into the memory unit. Further, in case of an enabled data-masking signal, the reconstruction does not even have to be performed. This is shown more clearly with respect to FIGS. 5a and 5b, which show information receiving apparatus using the kind of data masking reception as illustrated with respect to FIG. 4, additionally providing means for discarding received data words in case of an enabled data masking signal.

Figure 5A:
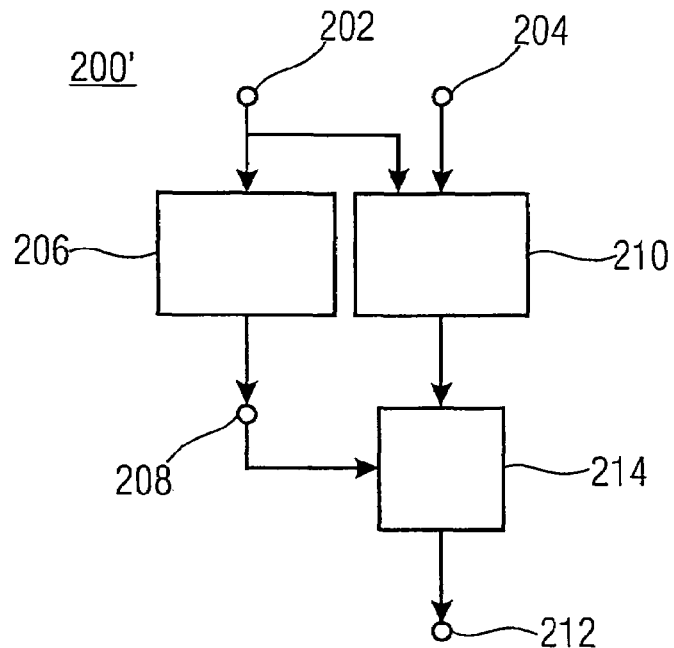
FIGS. 5a and 5b are block diagrams of an information receiving apparatus for receiving data masking information according to further embodiments of the present invention.
Figure 5B:
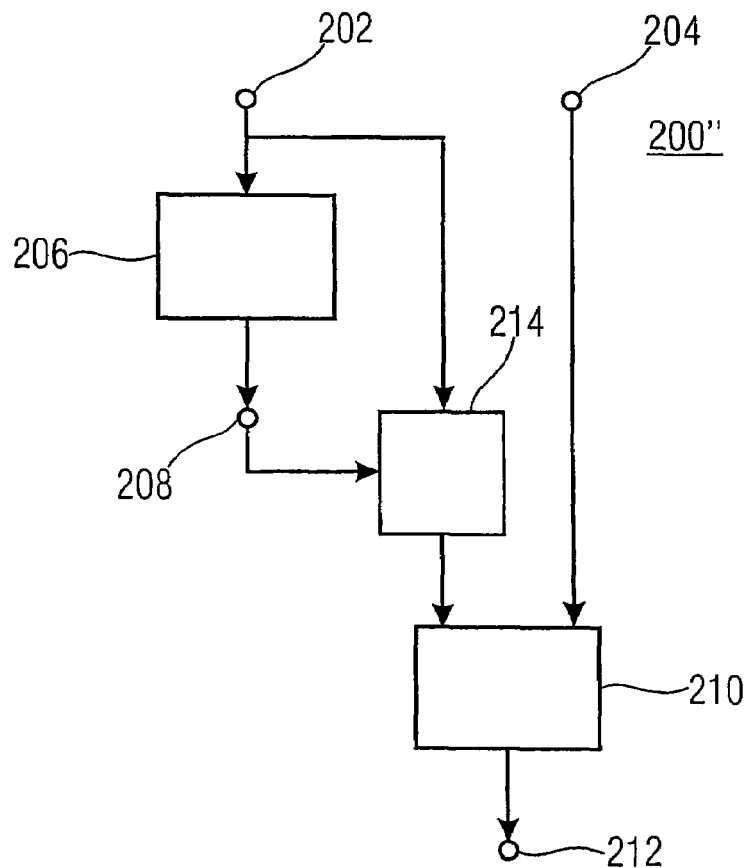

Elements in FIGS. 5a and 5b which are equal to elements in FIG. 4 are indicated by the use of the same reference signs, and therefore, the description of FIG. 4 with respect to these elements shall equally apply to the respective elements in FIGS. 5a and 5b.

FIG. 5a shows an information receiving apparatus 200' which differs from FIG. 4 (including the dashed lines), in that a discarder 214 is coupled between the reconstruction interface 210 and the data word output 212, the discarder further comprising an input being coupled to information receiving apparatus output 208 for receiving the data masking signal output by determiner 206. According to FIG. 5a, the reconstruction interface 210 and the discarder 214 are connected in series between the data input 202 and the data word output 212 with the discarder 214 succeeding the reconstruction interface 210. In this way, the data word reconstructed by reconstruction interface 210 from the data word at data input 202 is forwarded to the data word output 212 by the discarder 214 in the case of the data masking signal output by determiner 206 being disabled. However, otherwise, the discarder 214 prevents the data word output by reconstruction interface 210 from reaching the data word output 212, thereby ensuring the non-use or discardment of the result of the reconstruction performed by the reconstruction interface 210. The discarder may be implemented as a switch, or as a multiplexer.

FIG. 5b shows an information receiving apparatus 200" differing from the information receiving apparatus 200' in FIG. 5a, in that the reconstruction interface 210 and the discarder 214 are serially connected between the data input 202 and the data word output 212 in reversed order, i.e. with the discarder 214 preceding reconstruction interface 210. In other words, in FIG. 5b, the discarder 214 is connected between the data input 202 and a data input of the reconstruction interface 210, while still being coupled to the information receiving apparatus output 208, whereas reconstruction interface 210 is directly coupled to the indication input 204 and the data word output 212, respectively. Hence, in accordance with FIG. 5b, the discarder 214 prevents an invalid data word at data input 202 from reaching the reconstruction interface 210 in case of an enabled data masking signal, so that it is ensured that this invalid data word is not used by circuitry attached to data word output 212.

In the following, embodiments of the present invention will be described, according to which the data masking signal is transmitted between a transmitter and the receiver by use of unused states of a DBI interface.

FIG. 6 shows an arrangement of the transmitter 300, and the receiver 400 being connected via a channel 500. In particular, the transmitter 300 comprises a DBI pin 302 and 8 data pins 304. Similarly, receiver 400 comprises a DBI pin 402 and 8 data pins 404. The DBI pins 302, 402, and the data pins 304, 404 are connected to each other, respectively, via respective sub-channels 502, 504, respectively, with the latter, for example, being implemented as conductor lines on, for example, a printed circuit board.

The transmitter 300 comprises an 8-bit input data register 306, along with a data masking signal bit register 308, as well as a processor 310, a DBI module 312, a multiplexer 314 and an invalidator 316. The processor 310 is connected between the input data register 306 and the DBI module 312 and performs some processing on the data in the input data register 306, i.e., the 8-bit D0 to D7. The processing may comprise an encoding or scrambling or the like. Alternatively, processor 310 may be absent with the input data register 306 being directly coupled to the input of the DBI module 312.

The DBI module 312 is for mapping the incoming 8-bit data words into DBI'ed data words, such that the DBI'ed data words have a number of 0s or 1s, respectively, which is always below a predetermined limit, as will be described in more detail with respect to FIGS. 7 to 8b. The DBI module 312 outputs the DBI'ed 8-bit data words at a DBI module data output, which is connected to a first input of multiplexer 314. The DBI module 312 further comprises an inversion signaling output, which is connected to the DBI pin 302. The invalidator 316 is connected between the DBI module data output and a second input of multiplexer 314, and is for invalidating incoming DBI'ed data words, so that the number of 0s or 1s in the data words is no longer below the predetermined limit. The multiplexer 314 comprises an output which is connected to the data pins 304 and has a control input which is coupled to the data masking signal bit register 308. The multiplexer 314 is for connecting either the first input or the second input to the data pins 304, depending on the signal at the control input.

The receiver 400 comprises a determining/discarding module 406, a reconstruction module 408 and a data mask command signaling output 410. The determining/discarding module 406 has an input connected to the data pins 404 and two data outputs, one of which is connected to an input of reconstruction module 408, and the other being connected to the data mask command signaling output 410. A further input of the reconstruction module 408 is connected to the DBI pin 402. Further, the reconstruction 408 comprises a data word output 412.

In the following, the functionality of the individual elements of FIG. 6 and their interaction will be described. For illustration purposes only, it is assumed that the transmitter is a memory buffer, whereas the receiver 400 is a memory unit such as a DRAM. In such a configuration, the transmitter 300 may prevent a usage such as a storage, of the data transmitted via sub-channel 504 on the receiver side, by use of the data masking signal in data masking signal bit register 308, as is described in more detail below.

Data words to be transmitted to the receiver side are consecutively written into input data register 306. The data to be transmitted is accompanied by a data masking signal bit DM, which is written into data masking signal bit register 308. The registers 306, 308 are written to by means of other circuitry in the transmitter 300 not shown here, for ease of understanding of the main principles, with respect to the data masking signal transmission. The processor 310 performs some processing on the data D0 to D7, and forwards the result to the DBI module 312.

The DBI module 312 performs, for example, a DBI DC functionality. That is, the DBI module 312 tries, for example, to minimize the occurrences of 0s in case the channel 500 is a high terminated system. Alternatively, the DBI module 312 may be implemented to minimize or reduce the occurrence of 1s, in case the channel 500 is a ground terminated system. The way, the DBI module 312 performs this minimization/reduction is described with respect to FIG. 7 in more detail. As is shown in FIG. 7, the DBI module 312 starts DBI encoding at step 600 upon reception of the 8-bit word D0 to D7, written in the following as D<7:0>.

In the following, it is assumed that each 8-bit word D<7:0> is accompanied by a further DBI bit which is preliminarily set to either 1 or 0. In particular, in the following example of FIG. 7, the DBI bit is preliminarily set to 1 and the DBI module 312 reduces the occurrences of 0s. However, the reduction or minimization of 1s is also possible, in which case the DBI bit could be preset to 0. Moreover, as may easily be understood from the following explanations, presetting of the DBI bit in advance of the further processing of the DBI module 312 may be omitted, as will be described in more detail subsequent to the description of FIG. 7. Moreover, although explained in more detail below, it is noted here that even a presetting to 0 with minimization of 0s and vice versa would be possible in which case the different meaning between the DBI bit and the data word becomes indistinct as far as the recognition of the validity or non-validity is concerned. Accordingly, in the following the DBI bit and the data bits are considered in common by considering the 9-bit data string they form although a more separated consideration would also be possible as it is set out in more detail below.

As is shown in FIG. 7, the 9-bit data string, i.e. D<7:0>+DBI, is analyzed in step 602, in order to determine the number of 0s in the D data bit string with D=9. In the following step 604, the DBI module 312 checks as to whether the number of 0s determined in step 602 exceeds M=4, i.e. D/2 round to the next lower integer. If this is the case, the DBI module 312 sets the DBI bit to 0 and inverts the remaining bits in the data bits string, i.e. the bits D<7:0> in step 606. Otherwise, the DBI module 312 leaves the data bit string unchanged as it is shown in step 608. After either step 606 or 608, the DBI process ends in step 610, by outputting the DBI bit to DBI pin 302 and the data bit D<7:0> to multiplexer 314 and invalidator 316, respectively.

In order to illustrate the functionality of the DBI module 312 more clearly, two examples for an inbound data string and a resulting outbound data string are shown in FIGS. 8a and 8b. In the example of FIG. 8a, there are only two '0' bits in the 9-bit data string composed of D<7:0> and the DBI bit. If more than M=4 0s would have been in the data string, it would have been more efficient to set the DBI bit to 0 and to invert the remaining bits D<7:0> due to, for example, the usage of a high terminated system in channel 500. However, since there are only two 0-bits in case of FIG. 8a, in step 608 of FIG. 7, the DBI bit remains 1, and the data bits D<7:0> also remain as they are, as is shown by the arrow.

In the example of 8b, there are five '0'-bits in the data bit string including D<7:0> and DBI bit. Accordingly, the DBI module 312 sets the DBI bit to 0 and inverts the data bits D<7:0> with the resulting data string being shown at the bottom of FIG. 8b. As can be seen, the resulting bit pattern of the data string has only four 0-bits, i.e. no more than M=4.

As already mentioned above, the DBI bit does not have to be preset. Accordingly, the determination in step 602 may be performed on the data bit D<7:0> only whereas the setting of the DBI bit could originally take place in steps 606 and 608, respectively, thereby forming the data bit string. Even in this case, the DBI state meanings of 0 and 1 may be switched. However, in this case only the number of 0s in the eight data bits D<7:0> would be limited to up to 4, and the resulting data string at 610 could have five zeros. In this case, the distinction between valid and non-valid data strings at the receiver would have to be performed based on the 8 data bits only by checking as to whether the number of 0s in these eight bits does not exceed four.

In any case, the DBI bit is forwarded to the DBI pin 302, whereas the remaining part of the data string is forwarded to multiplexer 314 and invalidator 316, respectively. As becomes clear from the above description of FIGS. 7 to 8b, the operating principle of the DBI module 312 excludes certain data patterns from occurring, for example, it is impossible to have more than M occurrences of 0s in the bits of the data string output by the DBI module 312, with M exemplarily being 4 in the case just described. These non-occurring states or invalid states can be used to transmit information. This use of non-occurring states is sometimes called an overload of the DBI functionality or the DBI data string output by the DBI module 312 in the following.

The DBI data mapping performed by DBI module 312 is exploited to send the DM information in data masking signal bit register 308, by using these non-occurring or disallowed states, what will be described in more detail in the following.

As can be seen from FIG. 6, the DBI'ed data D<7:0> is multiplexed with the DM information contained in the data masking signal bit register 308, by means of multiplexer 314. In particular, if DM is equal to 0, for example, then the data to be transmitted, in input data register 306 shall not be masked. So, in this case, the DBI bit and the DBI'ed data is allowed to pass to the receiver 400, and the multiplexer 314 forwards the DBI'ed data to the data pins 304. By this measure, the information is handled as normal data with DBI information. However, in the case where DM equals 1, for example, masking of the transmitted data in input data register 306 shall occur and the following processing occurs. The invalidator 316 outputs an invalid data word of 8-bits, i.e., an 8-bit word having more than M 0-bits, to the multiplexer 314, which forwards this data word further to the data pins 304, instead of the DBI'ed data at the first multiplexer input. To this end, the invalidator 316 would not have to have an input connected to the output of the DBI module 312. Instead, the invalidator 316 could constantly output invalid data words to the second output of the multiplexer 314. However, in accordance with the embodiment shown in FIG. 6, the invalidator 316 modifies the DBI'ed data output by the DBI module 312 to the extent that this data becomes invalid, i.e. the number of 0s exceeds M. For example, the invalidator 316 adds 0s to the DBI'ed data until the number of zeros exceeds M. As has been described above, states where the DBI'ed data comprises more than M 0s may not occur. Therefore, the invalidator 316 adds 0s to the DBI'ed data portion, until the number of 0s equals, for example, D-M, thereby producing a disallowed DBI state which is output to the second input of multiplexer 314, with D-M being 5 in the present example. The multiplexer 314 then forwards this new data with more than the M occurrences of 0s to the data pins 304, to be transmitted to the reception side, along with the DBI bit.

At the receiver side, the DBI receiver 400 is able to recognize a disallowed DBI state, i.e. more than M occurrences of 0s in the D-bit data string consisting of the DBI bit at DBI pin 402 and the data bits at data pins 404. If such a state is received, then the data is simply discarded. To this end, the determining/discarding module 406 checks the incoming data bits D<7:0> to see if the number of 0s in these data bits exceeds or is equal to D-M. If this is the case, the D-bit data string received from the transmitter side is invalid and determining/discarding module 406 interprets this as a data mask command, which is signaled at data mask command signaling output 410 indicating that the data bits at the data pins 404 have to be ignored. Otherwise, determining/discarding module 406 forwards the data bits D<7:0> to the reconstruction module 408, which reconstructs, based on these bits, along with the DBI bit, the actual data word D0 to D7 and outputs this data at data word output 412.

Various modifications could be performed on the above embodiments, for example, the DBI module 312 could be designed to reduce or minimize the number of 1s instead of the number of 0s in the data word in input data register 306.

Moreover, the meaning of the DM bit in data masking signal bit register 308 could be logically inverted to indicate the masking of data when being 0. Further, it is possible to code additional information into the DM state to improve the probability of proper transmission as well. It is recalled, for example, that more than M 0s is a disallowed state, and will therefore be handled as DM=1 at the receiver 400. If only M plus 1 0s are coded, as illustrated in FIG. 6, then it is possible that a bit "flipping" during transmission via channel 500, results in the receiver 400 receiving a data string with only M 0s and handling the data erroneously as normal DBI data. The information DM=1 would be lost. However, if the code word output by invalidator 316 has M+2 0s, then it would be ensured that even if one bit flipped during transmission to the receiver 400, the data masking signal state would still be recognized and probably handled at the receiver side. The just-mentioned example is only one possible variation. There are many other possible possibilities limited only be the number of "disallowed" states. One could code various disallowed states that are recognized by the receiver as a data masking signal, for purposes of limiting data toggling in the channel, equalizing toggling/noise levels, etc. Multiple functions for the disallowed states are also not forbidden. Moreover, the above mentioned example of FIG. 6 is not limited to DBI DC. Even with DBI AC, where the previous state is calculated into the code, an incorrect following state could still be considered as the "disallowed" state and be used for other proposals.

In other words, the above mentioned embodiments of the present invention provide a method for transmitting information, such as a data mask signal, by overloading a data interface, such as by overloading data bit inversion states. Advantageously, the above-described embodiments do not suffer from problems resulting from other possibilities for transmitting the data mask signal. For example, the provision of a dedicated DM pin has the disadvantage in that this additional pin has to be provided on the chip. In comparison to sending the DM signal over the existing data+DBI pins, the above embodiments do not suffer from data and possibly DM signal bandwidth reduction, due to inability of sending data and DM signals in parallel. Moreover, no new command has to be coded on the command and address pins. Similarly, sending the DM signal over the address pins can be disadvantageous in that the DM bandwidth is reduced due to the reduced number of address pins in comparison to data pins, and the need for an additional command. Moreover, a mixing of internal addresses and data paths is not necessary. In comparison to these comparative possibilities, the above-mentioned embodiments send the information via invalid states of an existing interface. For example, in the embodiment of FIG. 6, the DM signal is sent over the DBI states. Advantageously, the DM bandwidth is the same as that achievable by providing an especially dedicated DM pin, without having to provide for this dedicated DM pin. Moreover, there is no need for additional commands, since the DM signal is transmitted in parallel to the data.

A further advantage of the embodiment of FIG. 6 is that other measures, such as error detection code algorithms, which run on the data/DBI pins, will also be applied to the transmitted DM states, which gives a certain amount of error detection coverage to the DM transmission as well.

With regard to the above embodiments, it is noted that especially in the embodiments of FIG. 3 to 8b, the description focuses on the DBI'ed data. However, in effect, the difference between the DBI bit and the DBI'ed data in the sense of DBI validity or invalidity, is fluid. Accordingly, and as is illustrated by means of dotted lines in FIGS. 3 and 4, the modification, as well as the determination in blocks 110 and 216, respectively, may also involve the modification/inversion of the signaling bit, as has already been outlined with respect to FIG. 6 where it has been stated with respect to FIG. 7 that the DBI bit may be preset to 0 instead of 1. Similarly, the modules 314 and 316 in FIG. 6, which act like a modifier 110 in FIG. 3, could act on the 9-bit string including the DBI bit, and in the receiver in FIG. 6, the determining/discarding module 406 could also act on the whole 9-bit data string, including the DBI bit from the DBI pin 302 or 402.

Regarding the possible implementations, it is noted that the discarder 214 in FIGS. 5a and 5b, may be implemented as switches, whereas the other modules shown and the figures could be implemented as logic circuits. Transmitter and Receiver may be implemented on a chip, respectively, such as in form of an ASIC. An implementation in FPGA is also possible. However, it is also possible that the above embodiments are implemented as a computer program.

Depending on certain implementation requirements of the embodiments of the inventive methods, embodiments of the inventive methods can be implemented in hardware or in software. The implementation can be performed using a digital storage medium, in particular, a disc, a CD or a DVD, having an electronically readable control signal stored thereon, which cooperates with a programmable computer system, such that an embodiment of the inventive methods is performed. Generally, an embodiment of the present invention is, therefore, a computer program product with a program code stored on a machine-readable carrier, the program code being operative for performing an embodiment of the inventive methods, when the computer program runs on the computer, a processor, or another integrated circuit. In other words, embodiments of the inventive methods are therefore, a computer program having a program code for performing at least one of the inventive methods, when the computer program runs on a computer, processor, or another integrated circuit.

While the foregoing has been particularly described with reference to particular embodiments thereof, it will be understood by those skilled in the art that various other changes in the forms and details may be made without departing from the broader spirit and scope thereof. It is to be understood that various changes may be made in adapting to different embodiments without departing from the broad concept disclosed herein, and comprehended by the claims that follow.

Lastly, it is noted that in the present application the term "coupled" is used to indicate that a certain module is directly or indirectly connected to another module.

What is claimed is:

1. An information transmitting apparatus comprising:
a first node carrying a valid data word;
a second node for carrying information to be transmitted, the information having at least three states, a first state indicating that the valid data word is to be transmitted and at least two second states, each second state representing a separate command;
an interface comprising a first input coupled to the first node, a second input coupled to the second node and an output, wherein the interface is adapted to provide the valid data word when the information is in the first state, a first data word recognizable as an invalid data word when the information is in a first of the at least two second states or a second data word recognizable as an invalid data word at the output when the information is in a second of the at least two second states;
an n-bit data input for carrying an actual n-bit data word to be transmitted; and
a mapper coupled between the n-bit data input, the mapper adapted to selectively modify the actual n-bit data word based on a predetermined criteria, to provide the selectively modified actual n-bit data word as the valid data word to the first node, and to provide a separate output signal indicating whether or not the n-bit data word has been modified.

2. An information transmitting apparatus comprising:
a first node carrying one of a plurality of valid data words;
a second node for carrying information to be transmitted, the information having at least three states, a first state indicating that the one of a plurality of valid data words is to be transmitted and at least two second states, each second state representing a separate command;
an interface comprising a first input coupled to the first node, a second input coupled to the second node and an output, wherein the interface is adapted to provide the one of a plurality of valid data words when the information is in the first state, a first data word recognizable as an invalid data word when the information is in a first of the at least two second states or a second data word recognizable as an invalid data word at the output when the information is in a second of the at least two second states;
an n-bit data input for carrying an actual n-bit data word to be transmitted; and
a data bit inversion module coupled to the n-bit data input and adapted to provide an n-bit output data word on a first output coupled to provide the one of a plurality of valid data words on the first node, the n-bit output data word being either inverted or non-inverted relative to the actual n-bit data word to be transmitted based on a determination whether a number of 0s or 1s within bits of the actual n-bit data word to be transmitted is within a predetermined range, the data bit inversion module also adapted to provide an inversion signal on a separate output indicating the inversion or non-inversion of the actual n-bit data word to be transmitted.

3. An information receiving apparatus, comprising:
a node for carrying a data word;
an interface comprising an input coupled to the node and an output for outputting an information signal, wherein the interface derives the information signal depending on whether the data word is a valid data word or an invalid data word, wherein the information signal has at least three states, a first state indicating that the data word is valid and at least two second states, each second state representing a separate command;
wherein the input is an m-bit data word input for receiving an m-bit data word including an inversion signal and an n-bit data word, wherein the interface further comprises a determiner coupled to the m-bit data word input and adapted to derive the information signal depending on whether a number of 0s or 1s within bits of the m-bit data word is within a predetermined range.

4. The information receiving apparatus according to claim 3, wherein the information signal depends on whether the number of 0s or 1s within the m-bit data word is not below a predetermined limit.

5. The information receiving apparatus according to claim 3, further comprising:
a data word output for an actually transmitted data word; and
a reconstructer coupled to the input of the interface and comprising a reconstruction output coupled to the data word output so that the actually transmitted n-bit data word is inverted or non-inverted relative to the n-bit data word depending on the inversion signal.

6. An information receiving apparatus, comprising:

a node for carrying a data word;

an interface comprising an input coupled to the node and an output for carrying information, wherein the interface derives the information depending on whether the data word is a valid data word or an invalid data word, wherein the input is an m-bit data word input for receiving an m-bit data word including an inversion signal and an n-bit data word, the interface further comprising a determiner coupled to the m-bit data word input and comprising an information output for an information signal depending on whether a number of 0s or 1s within bits of the m-bit data word is within a predetermined range, the information output being coupled to the output of the interface;

a data word output for an actually transmitted data word;

a reconstructer coupled to the input of the interface and comprising a reconstruction output coupled to the data word output so that the actually transmitted n-bit data word is inverted or non-inverted relative to the n-bit data word depending on the inversion signal; and a discarder coupled in series to the reconstructer between the input of the interface and the reconstruction output, the discarder being coupled to the output of the interface, the discarder enabling a passage from the input of the interface to the reconstruction output or preventing the passage, depending on the information.

7. An information receiving apparatus, comprising:

an m-bit data word input for an m-bit data word including an inversion signal and an n-bit data word;

a determiner coupled to the m-bit data word input and comprising an information output for an information signal representing an information, the information signal depending on whether the number of 0s or 1s within bits of the m-bit data word is within a predetermined range;

a data word output for an actually transmitted n-bit data word;

a reconstructer being coupled to the m-bit data word input and comprising a reconstruction output coupled to the data word output so that the actually transmitted n-bit data word is inverted or non-inverted relative to the n-bit data word depending on the inversion signal; and a discarder coupled in series to the reconstructer, between the m-bit data word input and the reconstruction output, the discarder being coupled to the information output, to enable a passage from the input of the interface to the reconstruction output or prevent the passage, depending on the information.

8. The information receiving apparatus according to claim 7, wherein the m-bit data word input is divided into an n-bit sub-input for the n-bit data word and a data bit inversion input for the inversion signal, the determiner being coupled to the n-bit sub-input with the information signal depending on whether a number of 0s or 1s within the n-bit data word is not below a predetermined limit.

9. The information receiving apparatus according to claim 7, wherein the information signal depends on whether the number of 0s or 1s within the m-bit data word is not below a predetermined limit.

* * * * *